US011448473B2

(12) United States Patent
Laneryd et al.

(10) Patent No.: US 11,448,473 B2
(45) Date of Patent: Sep. 20, 2022

(54) HEAT EXCHANGING ARRANGEMENT AND SUBSEA ELECTRONIC SYSTEM

(71) Applicant: ABB Schweiz AG, Baden (CH)

(72) Inventors: Tor Laneryd, Enköping (SE); Thomas Gradinger, Aarau Rohr (CH); Thomas Wagner, Urdorf (CH); Heinz Lendenmann, Västerås (SE)

(73) Assignee: ABB Schweiz AG, Baden (CH)

( * ) Notice: Subject to any disclaimer, the term of this patent is extended or adjusted under 35 U.S.C. 154(b) by 162 days.

(21) Appl. No.: 16/851,650

(22) Filed: Apr. 17, 2020

(65) Prior Publication Data

US 2020/0340763 A1 Oct. 29, 2020

(30) Foreign Application Priority Data

Apr. 23, 2019 (EP) .................................... 19170598

(51) Int. Cl.
*F28F 3/06* (2006.01)
*F28F 9/26* (2006.01)
(Continued)

(52) U.S. Cl.
CPC .................. *F28F 3/06* (2013.01); *F28F 9/26* (2013.01); *H05K 5/067* (2013.01); *H05K 7/2039* (2013.01); *F28F 2275/10* (2013.01)

(58) Field of Classification Search
CPC .. H05K 7/20263; H05K 5/067; H05K 7/2039; H05K 7/20409; H05K 7/209; H05K 7/20418; H05K 7/14; H05K 7/20818; F28F 1/40; F28F 9/26; F28F 13/00; F28F 21/062; F28F 9/22; F28F 3/06; F28F 2275/10; F28F 3/025; F28F 3/027; F28F 1/128;
(Continued)

(56) References Cited

U.S. PATENT DOCUMENTS 2,481,046 A * 9/1949 Scurlock ............... E04C 2/3405 428/116
3,068,026 A * 12/1962 McKamey ............ F16L 39/005 62/50.7
(Continued)

FOREIGN PATENT DOCUMENTS

EP 2487326 A1 * 8/2012 ......... E21B 41/0007
EP 2487327 A1 * 8/2012 ......... E21B 41/0007
(Continued)

OTHER PUBLICATIONS

Yu Robert, Device for cooling an element that is liable to heat up, particular an electric vehicle battery pack, Dec. 28, 2017 (Year: 2017).*
(Continued)

*Primary Examiner* — Michael A Matey
(74) *Attorney, Agent, or Firm* — Leydig, Voit & Mayer, Ltd.

(57) ABSTRACT

A heat exchanging arrangement for a subsea electronic system, the heat exchanging arrangement including a wall section; a corrugation formed in the wall section, the corrugation having two generally opposing internal corrugation surfaces; and at least one heat exchanging element forced against at least one of the internal corrugation surfaces. A subsea electronic system including a heat exchanging arrangement is also provided.

20 Claims, 4 Drawing Sheets

(51) Int. Cl.
*H05K 7/20* (2006.01)
*H05K 5/06* (2006.01)

(58) Field of Classification Search
CPC ......... F28F 1/126; F28F 1/105; H01L 23/473; E21B 36/001; E21B 36/005; E21B 41/0007; E21B 17/01; F28D 15/0233; F28D 15/0275; F28D 1/022; F28D 2021/0028; F28D 2021/0029; F28D 21/0017; F28D 9/005; F28D 9/0093; F24T 10/13; E04H 7/02
See application file for complete search history.

(56) References Cited

U.S. PATENT DOCUMENTS

| | | | | | |
|---|---|---|---|---|---|
| 3,608,640 | A * | 9/1971 | Willhite | E21B 36/003 166/57 |
| 3,612,176 | A * | 10/1971 | Bauer | E21B 17/01 166/359 |
| 4,278,277 | A * | 7/1981 | Krijgsman | E21B 33/04 285/123.17 |
| 4,548,273 | A * | 10/1985 | Leicht | E21B 33/043 166/123 |
| 5,124,087 | A * | 6/1992 | Bradley | B01J 19/32 261/112.2 |
| 7,796,391 | B2 * | 9/2010 | Fischer | H02S 40/34 165/80.3 |
| 7,810,560 | B2 * | 10/2010 | Lembcke | E21B 17/1035 166/242.6 |
| 8,286,701 | B2 * | 10/2012 | Schultz | E21B 23/00 166/242.6 |
| 11,116,106 | B2 * | 9/2021 | Harada | H05K 7/20272 |
| 2009/0211733 | A1 * | 8/2009 | Tranier | F25J 5/002 165/104.21 |
| 2011/0067880 | A1 * | 3/2011 | Adamek | E21B 17/01 166/345 |
| 2015/0323263 | A1 * | 11/2015 | Yanachi | F28F 1/022 165/154 |
| 2017/0280577 | A1 | 9/2017 | Laneryd et al. | |
| 2018/0252476 | A1 * | 9/2018 | Johnson | F21V 29/75 |
| 2018/0313372 | A1 * | 11/2018 | Trandal | G01M 3/027 |
| 2019/0093641 | A1 * | 3/2019 | Sumrall | F03G 7/04 |
| 2021/0013390 | A1 * | 1/2021 | Vanderwees | F21V 29/70 |

FOREIGN PATENT DOCUMENTS

| | | | | |
|---|---|---|---|---|
| EP | 2487327 | A1 | 8/2012 | |
| EP | 2610881 | A1 * | 7/2013 | E21B 41/0007 |
| EP | 2824275 | A1 * | 1/2015 | E21B 33/0355 |
| EP | 2919571 | A1 | 9/2015 | |
| EP | 2928275 | A1 * | 10/2015 | F28D 1/022 |
| EP | 2988311 | A1 * | 2/2016 | F28D 1/022 |
| GB | 2209388 | A * | 5/1989 | F28D 1/0308 |
| WO | WO-2017220882 | A1 * | 12/2017 | F28D 15/02 |
| WO | 2018189009 | A1 | 10/2018 | |
| WO | WO-2019100170 | A1 * | 5/2019 | F28D 1/0341 |

OTHER PUBLICATIONS

European Patent Office, Extended Search Report issued in corresponding Application No. 19170598.7, dated Oct. 16, 2019, 6 pp.

* cited by examiner

HEAT EXCHANGING ARRANGEMENT AND SUBSEA ELECTRONIC SYSTEM

TECHNICAL FIELD

The present disclosure generally relates to a heat exchanging arrangement. In particular, a heat exchanging arrangement for a subsea electronic system, and a subsea electronic system comprising a heat exchanging arrangement, are provided.

BACKGROUND

Electronic devices for subsea electrification can advantageously be submerged in a tank or enclosure containing a dielectric fluid. Examples of such electronic devices are static induction devices, such as transformers, and power electronic equipment, such as power converters, variable speed drives or HVDC (high-voltage direct current) valves. The enclosure and the electronic devices inside the enclosure form a subsea electronic system. The dielectric fluid acts as electric insulation and cooling medium and can be used with one or more pressure compensators to achieve an internal pressure close to or equal to the external pressure of the ambient seawater.

The cooling of the electronic devices may be provided by means of passive cooling where the dielectric fluid is driven by natural convection. The dielectric fluid will be heated up by power losses from the electronic devices and experience a buoyancy force upwards. Hot fluid in the vicinity of the enclosure walls will be cooled down and experience a buoyancy force downwards. These upward and downward buoyancy forces generate a circulating flow of dielectric fluid within the enclosure for transferring heat to the external seawater.

Due to the relatively low cooling performance of natural convection cooling, a large surface area is required to keep a sufficiently low temperature for reliable long term operation of the subsea electronic system. In order to increase the cooling surface, the enclosure walls may comprise corrugations. However, in many implementations, enclosure walls comprising corrugations do not provide sufficient cooling. Thus, the relatively low heat transfer from the dielectric fluid, through the enclosure wall, and to the ambient seawater, limits the thermal performance of the subsea electronic system. The low heat transfer through the enclosure wall is therefore a bottle neck in many types of subsea electronic systems. For this reason, the enclosure may be provided with one or more external heat exchangers, such as a tube bundle connected to a enclosure wall, for augmenting the cooling.

WO 2018189009 A1 discloses a heat exchanging arrangement for a subsea electronic system. The heat exchanging arrangement comprises at least one pipe having an external surface; and at least one heat exchanging element arranged inside the at least one pipe and defining at least one internal passage for conducting a dielectric fluid through the at least one pipe. The at least one heat exchanging element is arranged to press laterally outwards against an internal surface of the at least one pipe to establish a heat transfer bond between the at least one heat exchanging element and the at least one pipe.

EP 2487327 A1 discloses a subsea electronic system comprising a water tight enclosure adapted to enable an operation of the system under water. A heat generating electronic device is arranged in the enclosure. The electronic device generates heat in operation. The enclosure is at least partially filled with a dielectric liquid in which the electronic device is at least partially submerged. A heat sink is arranged on a wall of the enclosure and thermally coupled thereto.

SUMMARY

One object of the present disclosure is to provide a heat exchanging arrangement for a subsea electronic system, which heat exchanging arrangement provides an efficient heat transfer performance.

A further object of the present disclosure is to provide a heat exchanging arrangement for a subsea electronic system, which heat exchanging arrangement has a compact, cheap, robust and/or simple design.

A still further object of the present disclosure is to provide a heat exchanging arrangement for a subsea electronic system, which heat exchanging arrangement enables simple and/or fast manufacture.

A still further object of the present disclosure is to provide a heat exchanging arrangement for a subsea electronic system, which heat exchanging arrangement has a reliable operation.

A still further object of the present disclosure is to provide a heat exchanging arrangement for a subsea electronic system, which heat exchanging arrangement solves several or all of the foregoing objects in combination.

A still further object of the present disclosure is to provide a subsea electronic system comprising a heat exchanging arrangement, which subsea electronic system solves one, several or all of the foregoing objects.

According to one aspect, there is provided a heat exchanging arrangement for a subsea electronic system, the heat exchanging arrangement comprising a wall section; a corrugation formed in the wall section, the corrugation having two generally opposing internal corrugation surfaces; and at least one heat exchanging element forced against at least one of the internal corrugation surfaces.

Since the at least one heat exchanging element is provided on the inside of the wall section, the heat exchanging arrangement according to the present disclosure may be referred to as an internal heat exchanging arrangement. The at least one heat exchanging element may be partly or entirely accommodated within the corrugation. The heat exchanging arrangement thus makes use of the space within the corrugations to improve the cooling performance of the subsea electronic system by means of an increased heat transfer through the wall section. This is advantageous for several reasons.

External heat exchanging arrangements, such as external tube bundles, can be avoided, reduced in number, or dimensioned smaller. This facilitates manufacture and makes the subsea electronic system more robust. For example, the risk of damage to external heat exchanging arrangements during transportation can be reduced or eliminated. External heat exchanging arrangements may sometimes require dedicated protection solutions during transportation.

Furthermore, the heat exchanging arrangement also enables the use of continuous wall sections, with no or few welds. This is advantageous since welds make the manufacturing process more tedious and the risk of leakages is increased. By reducing the number of welds, the reliability of the subsea electronic system can be increased. Continuous wall sections with no or few welds are also simpler to clean, e.g. from marine growth.

Furthermore, the heat exchanging arrangement can be implemented in a subsea electronic system without, or with reduced, occupation of an interior space of an enclosure of the subsea electronic system. The heat exchanging arrangement thereby enables the construction of an enclosure for an electronic device, which enclosure has small external dimensions without compromising, or with reduced compromise of, the internal space of the enclosure. Thereby, the heat exchanging arrangement can be provided to a subsea electronic system without having to increase the electrical insulation distance to electronic devices within an enclosure of the subsea electronic system. The heat exchanging arrangement thus enables a small and light design of a subsea electronic system while still providing excellent heat transfer performance. That is, the heat exchanging arrangement enables a reduction in size and/or higher rating of the subsea electronic system. For example, the heat exchanging arrangement according to the present disclosure enables a reduction in size of a subsea electronic system while maintaining a given heat transfer performance.

By means of the forcing of the at least one heat exchanging element against at least one of the internal corrugation surfaces, a heat transfer bond can be established between the at least one heat exchanging element and the internal corrugation surface. Thereby, a good thermal contact can be ensured.

The heat exchanging arrangement may be configured such that the at least one heat exchanging element is forced substantially evenly, or evenly, against at least one of the internal corrugation surfaces. Alternatively, or in addition, the heat exchanging arrangement may be configured such that a substantially lateral force, or lateral force, is applied to the at least one heat exchanging element against at least one of the internal corrugation surfaces. Throughout the present disclosure, a lateral direction is a direction substantially perpendicular to, or perpendicular to, an extension direction of the corrugation.

The heat exchanging arrangement may be configured such that the at least one heat exchanging element is forced against at least one of the internal corrugation surfaces while maintaining the structural integrity of the wall section, e.g. without screws, bolts or other mechanical fasteners between the at least one heat exchanging element and the at least one internal corrugation surface. Although mechanical fasteners may provide a good thermal contact locally, the heat exchanging element may buckle away from the internal corrugation surface if the wall section and the heat exchanging element are made of materials with different thermal expansion coefficients, e.g. a wall section of steel and a heat exchanging element of aluminum. It may also be difficult to obtain an even pressure between a heat exchanging element and a flat surface by means of mechanical fasteners. Furthermore, attachment of a heat exchanging element to a flat surface by means of screws or bolts complicates manufacture.

The buckling problem can be avoided by instead bolting many single cooling pins, e.g. of aluminum, to a steel wall. However, this solution requires a complicated and time consuming manufacturing process. Welding and brazing of a heat exchanging element to a flat surface have the same disadvantages as mechanical fasteners.

The at least one heat exchanging element may be configured such that an area on the internal side of the wall section is increased, i.e. an area comprising the wall section in contact with a dielectric fluid contained in an enclosure of the subsea electronic system. This is advantageous since dielectric fluid typically has a lower heat transfer coefficient than seawater. Thus, the area of the internal side of the wall section may be increased both by means of the at least one corrugation and by means of the at least one heat exchanging element.

The corrugation may comprise exterior surfaces, e.g. opposite to the internal corrugation surfaces, arranged to be in contact with ambient seawater. Each corrugation may be generally U-shaped or generally V-shaped. The wall section may comprise one or more corrugations. The one or more corrugations provide an extension of an internal surface of the wall section, in comparison with a flat wall section without corrugations.

The heat exchanging arrangement may comprise a plurality of heat exchanging elements in the same corrugation, for example a plurality of pairs of heat exchanging elements in the same corrugation. Alternatively, or in addition, the heat exchanging arrangement may comprise a plurality of corrugations formed in the wall section and at least one heat exchanging element forced against an internal corrugation surface within each corrugation. In any case, each corrugation may have a substantially linear extension, or linear extension. The plurality of corrugations may be substantially parallel, or parallel.

The two internal corrugation surfaces may be oriented inwards, towards the interior of an enclosure of the subsea electronic system. Alternatively, or in addition, the two internal corrugation surfaces may form part of an internal surface of the wall section.

The corrugation and the at least one heat exchanging element may be made of different materials. Each of the at least one heat exchanging element may be made of a material having a thermal conductivity of at least 100 watts per metre per Kelvin (W/(m*K)) at atmospheric pressure and around 293 K, such as at least 200 W/(m*K). One example of such material is aluminum. The at least one heat exchanging element may be extruded. The corrugation may be made of a material resistant to seawater corrosion, such as stainless steel or metal.

The heat exchanging arrangement may optionally comprise glue between the at least one heat exchanging element and at least one of the internal corrugation surfaces. Although the glue may improve the thermal transfer between the heat exchanging element and the corrugation, the glue is sensitive to thermal cycling which may cause the heat exchanging element to detach from the internal corrugation surface. Glue may thus form a complement to the forcing of the at least one heat exchanging element against at least one of the internal corrugation surfaces. A mesh coating may also be provided on each internal corrugation surface.

The at least one heat exchanging element may be pushed against the at least one of the internal corrugation surface. By only pushing the at least one heat exchanging element against the at least one of the internal corrugation surfaces, the material integrity of corrugation can be maintained, in contrast to a wall section penetrated by a screw.

The at least one heat exchanging element may comprise two heat exchanging elements. In this case, each heat exchanging element may be forced against a respective internal corrugation surface. The two heat exchanging elements may thus be pushed away from each other, i.e. in substantially opposite directions.

The heat exchanging arrangement may comprise a force device arranged to force the at least one heat exchanging element against the at least one internal corrugation surface. According to one variant, the heat exchanging arrangement comprises a force device arranged to push a first heat exchanging element against a first internal corrugation surface and arranged to push a second heat exchanging element against a second internal corrugation surface. Alternatively, or in addition, the force device may be arranged to push the at least one heat exchanging element against the at least one internal corrugation surface by means of a force substantially perpendicular to, or perpendicular to, the at least one internal corrugation surface. The force device may be purely mechanical.

The force device may be arranged at least partly between the internal corrugation surface.

The force device may comprise a spring. One example of a suitable spring is a flexible linkage and/or a flat spring. Alternative types of force devices for forcing the at least one heat exchanging element against one or each internal corrugation surface are however conceivable. One possible alternative is an expansion tool.

The force device may comprise an adjusting mechanism for adjusting the forcing of the at least one heat exchanging element. The adjusting mechanism may for example comprise a screw bolt. By turning the screw bolt, the forcing of the at least one heat exchanging element by means of the force device can be adjusted.

The internal corrugation surfaces may be substantially flat, or flat. Other shapes of the two generally opposing internal corrugation surfaces of the corrugation are however conceivable.

The internal corrugation surfaces may be non-parallel, such as angled 90 degrees to 175 degrees relative to each other. The internal corrugation surfaces may or may not be directly connected to each other. For example, the corrugation may further comprise an outer joining section arranged between the internal corrugation surfaces.

The at least one heat exchanging element may be a heat sink. The at least one heat sink may be configured to provide an increased interior area to the interior side of the wall section, i.e. to increase the heat transfer area on the dielectric fluid side. The at least one heat exchanging element may for example comprise a plurality of heat dissipating elements, such as cooling fins or cooling pins, directed towards the dielectric fluid.

The at least one heat exchanging element may comprise a substantially flat element surface, or flat element surface, for mating with a respective internal corrugation surface. By means of a flat element surface mating with a flat internal corrugation surface, it is possible to obtain an even pressure distribution over the element surface.

Each heat exchanging element may further comprise an internal element structure, i.e. for exposure to the dielectric fluid within an enclosure of the subsea electronic system. The area of the internal element structure, may be at least 1.5 times, such as at least 2 times, as large as the area of the flat element surface.

The wall section and the corrugation may be made of sheet metal or sheet steel, such as a continuous metal sheet or a continuous steel sheet. One or more corrugations may be formed in a continuous sheet by providing a plurality of bends or curves in the sheet. The corrugation may thereby be said to be integrally formed in the wall section.

According to a further aspect, there is provided a subsea electronic system comprising a watertight enclosure containing dielectric fluid; at least one electronic device arranged inside the enclosure; and a heat exchanging arrangement according to the present disclosure; wherein the enclosure comprises the at least one wall section. The corrugation may form a part of a cooling circuit passing by the at least one electronic device.

Various different dielectric fluids may be used in the subsea electronic system according to the present disclosure. Examples of dielectric fluid include mineral oil and natural esters. Throughout the present disclosure, the dielectric fluid may be constituted by a dielectric liquid. The at least one electronic device may comprise static induction devices (e.g. transformers) and/or power electronic equipment (e.g. power converters, variable speed drives, or HVDC valves).

The at least one wall section may comprise a top wall section. Since hot dielectric fluid will move upwards due to thermal convection, the heat transfer will be high through the top wall section. By utilizing the top wall section for heat transfer in this way, cooling performance can be improved. Alternatively, or in addition, the at least one wall section may comprise a side wall section. That is, one or more corrugations, each containing at least one heat exchanging elements, may be provided in one or more side wall sections and/or a top wall section of the enclosure.

In case a heat exchanging arrangement according to the present disclosure is arranged in both the top wall section and in at least one side wall section of the enclosure, a flow of dielectric fluid generally horizontally along the top wall section and generally vertically downwards along the side wall section can be provided. Thereby, the circulation of the dielectric fluid is improved and the top wall section can contribute significantly to the heat transfer.

As used herein, a top wall section may be substantially horizontal, or horizontal. Alternatively, or in addition, an internal surface of the top wall section may be substantially horizontal, or horizontal. Furthermore, a side wall section may be substantially vertical, or vertical. Alternatively, or in addition, an internal surface of the side wall section may be substantially vertical, or vertical. In case the side wall section comprises one or more corrugations, each corrugation may extend substantially vertically, or vertically.

The subsea electronic system may be configured such that when the at least one electronic device is in use, the dielectric fluid circulates by natural convection. Thus, the subsea electronic system may be configured to provide a passive cooling. This improves the reliability of the subsea electronic system. Alternatively, one or more pumps may additionally be used to assist the circulation of the dielectric fluid in the cooling circuit.

The enclosure may comprise an upper part and a lower part, and the heat exchanging arrangement may comprise a plurality of heat exchanging elements. In this case, a density of heat exchanging elements may be higher in the upper part than in the lower part.

BRIEF DESCRIPTION OF THE DRAWINGS

Further details, advantages and aspects of the present disclosure will become apparent from the following embodiments taken in conjunction with the drawings, wherein.

DETAILED DESCRIPTION

Figure 1:
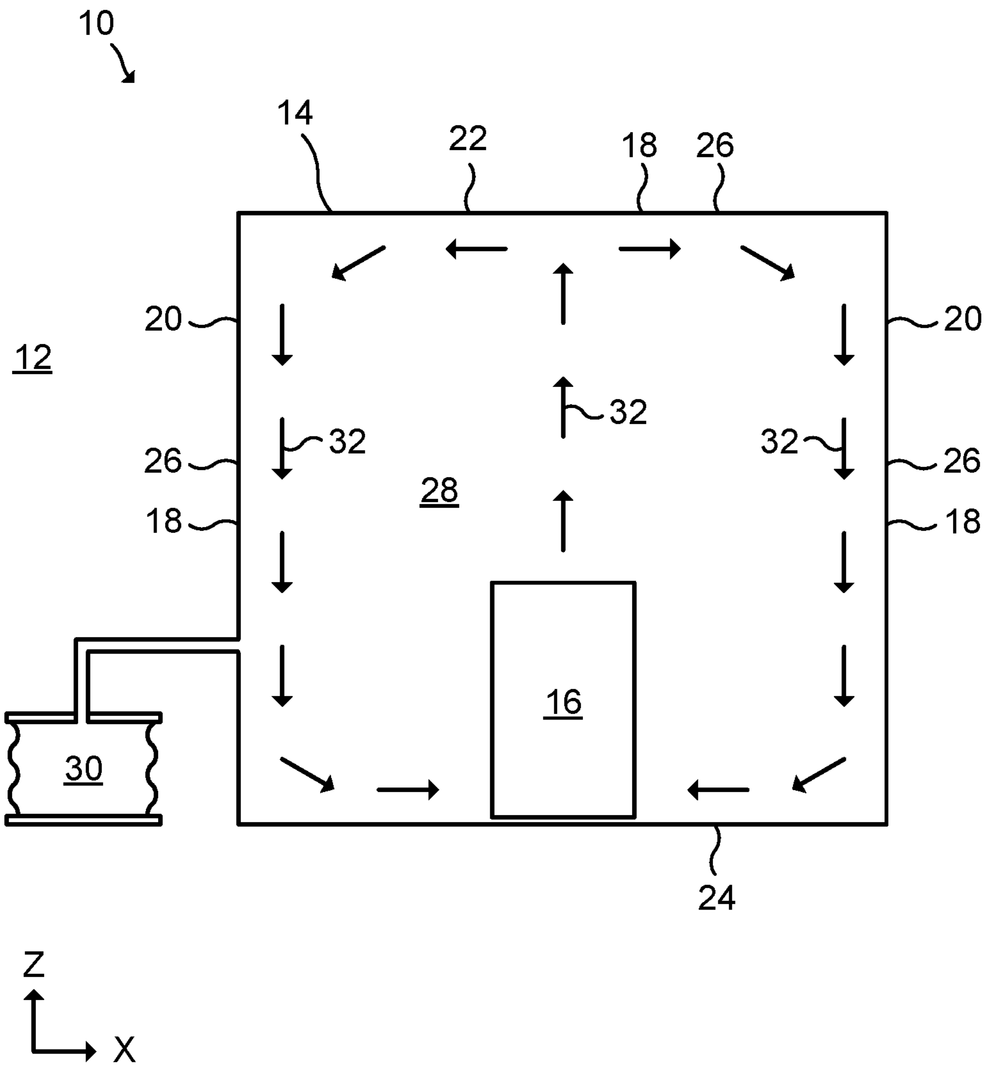
FIG. 1: schematically represents a side view of a subsea electronic system comprising an enclosure and a plurality of heat exchanging arrangements.

In the following, a heat exchanging arrangement for a subsea electronic system, and a subsea electronic system comprising a heat exchanging arrangement, will be described. The same reference numerals will be used to denote the same or similar structural features.

FIG. 1 schematically represents a side view of one example of a subsea electronic system 10 submerged in seawater 12. The subsea electronic system 10 comprises a watertight enclosure 14, an electronic device 16 and a plurality of heat exchanging arrangements 18. The enclosure 14 comprises four vertical side wall sections 20, a horizontal top wall section 22 and a bottom 24. Each wall section 20, 22 comprises corrugations 26 forming part of the heat exchanging arrangements 18. The corrugations 26 in the top wall section 22 are horizontal and the corrugations 26 in the side wall sections 20 are vertical. In this example, a heat exchanging arrangement 18 is arranged in each side wall section 20 and in the top wall section 22. Each wall section 20, 22 is made of a material resistant to seawater corrosion, such as stainless steel.

The electronic device 16 is arranged generally centered within the enclosure 14. The enclosure 14 is filled, at least partially, with a dielectric fluid 28. Several electronic devices 16, and other components, may also be arranged within the enclosure 14.

The subsea electronic system 10 of this example further comprises a pressure compensator 30 to compensate for volumetric changes of the dielectric fluid 28. The pressure compensator 30 is illustrated as a bellows pressure compensator but may be of alternative types. FIG. 1 further shows a Cartesian coordinate system for referencing purposes.

When the electronic device 16 is in operation, the dielectric fluid 28 will be heated up by power losses from the electronic device 16 and experience a buoyancy force upwards. Hot dielectric fluid 28 in vicinity of the top wall section 22 and the side wall sections 20 will enter the respective corrugations 26 and be cooled to experience a buoyancy force downwards. This will create a circulating flow of the dielectric fluid 28 in a cooling circuit 32 where heat carried by the dielectric fluid 28 is transferred to the ambient seawater 12. The enclosure 14 and the heat exchanging arrangements 18 of the subsea electronic system 10 thereby form a cooling system. The temperature difference between the dielectric fluid 28 in vicinity to the top wall section 22 and the ambient seawater 12 is relatively large. The provision of the heat exchanging arrangement 18 in the top wall section 22 is thereby particularly efficient.

In FIG. 1, the circulating flow of dielectric fluid 28 is driven by natural convection. However, the subsea electronic system 10 may be equipped with one or more pumps to assist the circulation of dielectric fluid 28.

Figure 2:
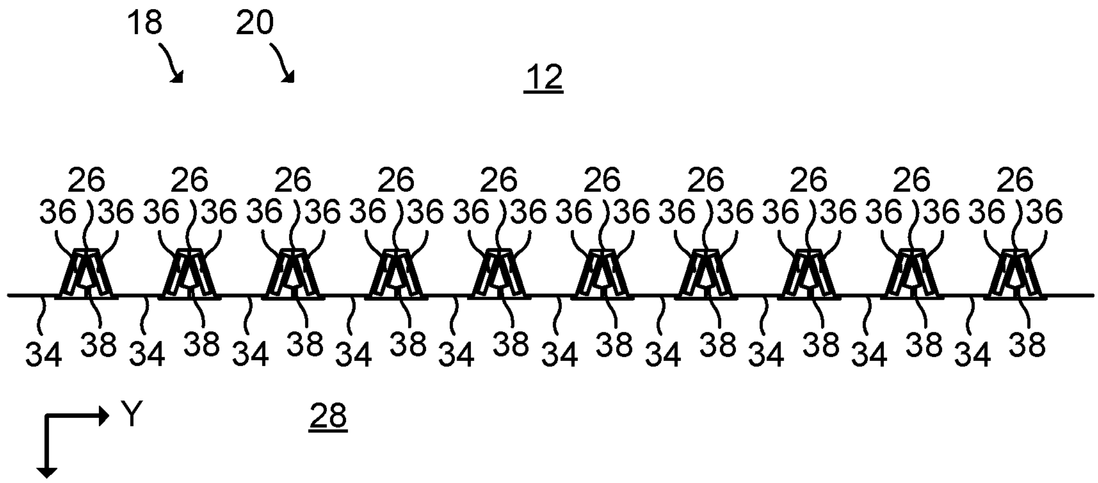
FIG. 2: schematically represents a cross-sectional top view of a heat exchanging arrangement comprising a side wall section of the enclosure in FIG. 1.
Figure 3:
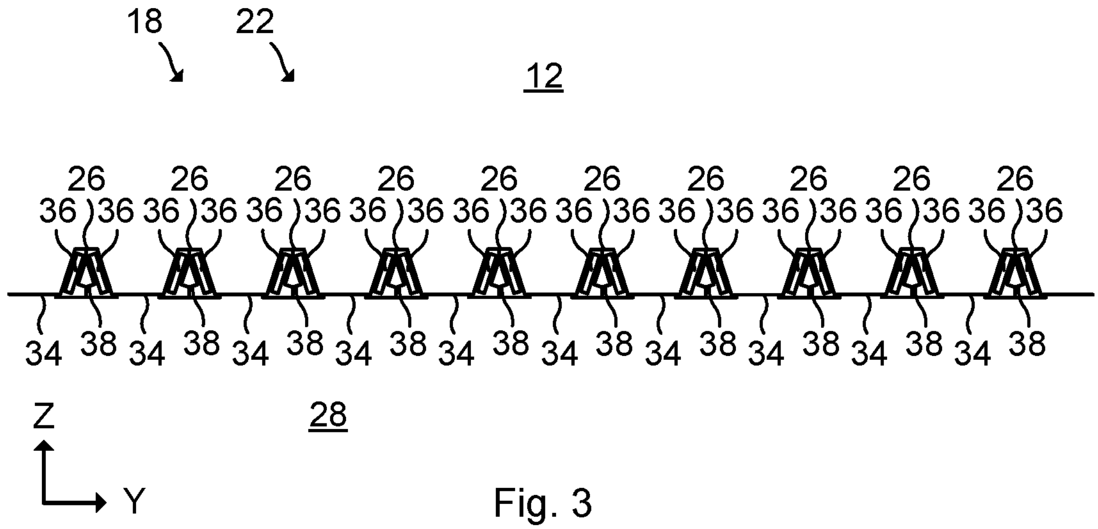
FIG. 3: schematically represents a cross-sectional side view of a heat exchanging arrangement comprising a top wall section of the enclosure in FIG. 1.

FIG. 2 schematically represents a cross-sectional top view of a heat exchanging arrangement 18 comprising one of the side wall sections 20 of the enclosure 14 in FIG. 1. FIG. 3 schematically represents a cross-sectional side view of a heat exchanging arrangement 18 comprising the top wall section 22 of the enclosure 14 in FIG. 1. With collective reference to FIGS. 2 and 3, each wall section 20, 22 comprises a plurality of parallel corrugations 26 providing an extended interior surface (and an extended exterior surface) of the wall section 20, 22. The wall sections 20, 22 have a generally wave formed profile comprising peaks and valleys. In this example, the corrugations 26 are formed in the wall sections 20, 22 by providing a plurality of bends to a continuous steel sheet of substantially uniform thickness. Generally flat inner joining sections 34 are formed in the respective wall section 20, 22 between the corrugations 26.

The heat exchanging arrangements 18 in FIGS. 2 and 3 comprise a plurality of heat exchanging elements 36. Each heat exchanging element 36 is provided inside a corrugation 26, on a side of the wall section 20, 22 in contact with the dielectric fluid 28. The heat exchanging arrangements 18 thus constitute internal heat exchanging arrangements. FIGS. 2 and 3 show a pair of two heat exchanging elements 36 accommodated within each corrugation 26. Additional pairs of heat exchanging elements (not shown) may be provided in each corrugation 26. By fitting a plurality of heat exchanging elements 36 within corrugations 26 in this manner, the footprint of the subsea electronic system 10 is reduced. FIGS. 2 and 3 further show that each heat exchanging arrangement 18 of this example comprises a force device 38.

Figure 4:
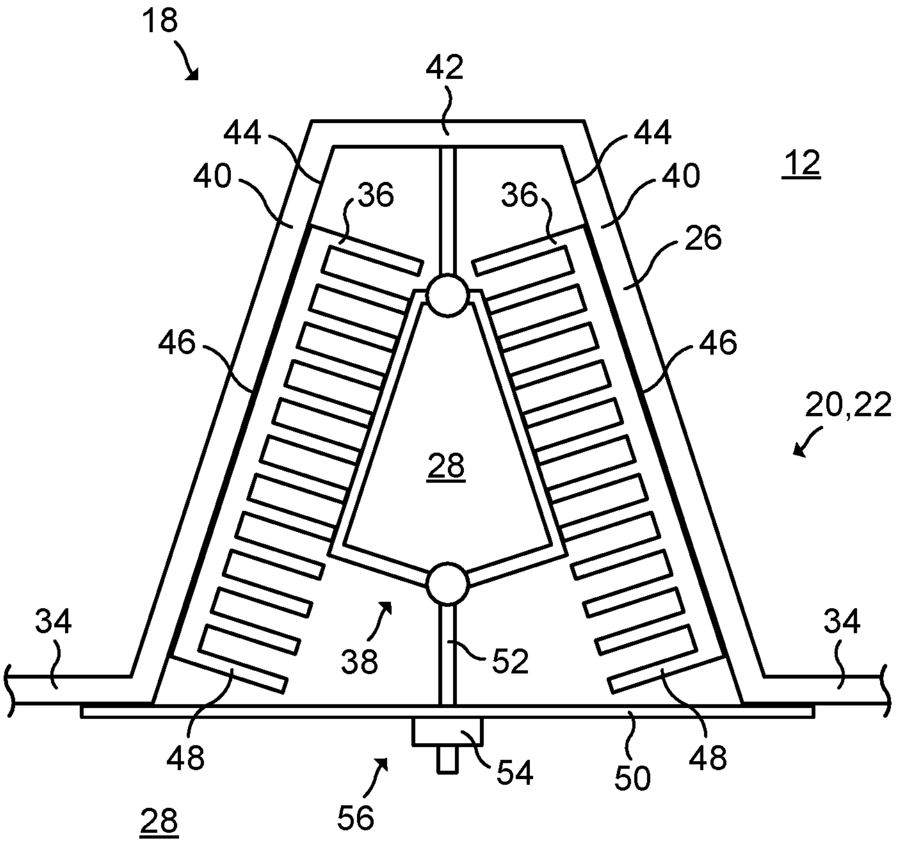
FIG. 4: schematically represents an enlarged cross-sectional view of a heat exchanging arrangement.

FIG. 4 schematically represents an enlarged cross-sectional view of one example of a heat exchanging arrangement 18. The following description of the heat exchanging arrangement 18 is applicable both for the heat exchanging arrangement 18 in the side wall sections 20 and in the top wall section 22. As shown in FIG. 4, the corrugation 26 comprises two generally opposing sections 40 and an outer joining section 42 between the opposing sections 40. A bend is formed in the wall section 20, 22 between the respective inner joining sections 34 and the respective opposition section 40 and between the outer joining section 42 and the respective opposing section 40.

Each opposing section 40 comprises an internal corrugation surface 44. The internal corrugation surfaces 44 are generally opposing and provided on the side of the wall section 20, 22 exposed to dielectric fluid 28. In this example, each internal corrugation surface 44 is flat. The angle between the internal corrugation surface 44 in this example is approximately 30° to 40°.

As shown in FIG. 4, the two heat exchanging elements 36 are entirely accommodated within the corrugation 26. In this example, each heat exchanging element 36 is a heat sink comprising a flat element surface 46 on one side and plurality of heat dissipating elements 48 on the opposite side. The heat dissipating elements 48 provide an increased exposed area towards the dielectric fluid 28. The heat dissipating elements 48 are here exemplified as substantially evenly distributed fins with substantially uniform thickness. Alternative, or additional, heat dissipating elements 48 may be used, such as pins. Each heat exchanging element 36 of this example is made of aluminum.

FIG. 4 further shows one example of a force device 38 according to the present disclosure. The force device 38 is arranged to force the heat exchanging elements 36 against an associated internal corrugation surface 44, i.e. the left heat exchanging element 36 against the left internal corrugation surface 44 and the right heat exchanging element 36 against the right internal corrugation surface 44.

The force device 38 of this example is a spring, more specifically a flexible linkage. The force device 38 may be made of steel. In the illustrated state of the force device 38, the force device 38 is compressed such that the force device 38 generates lateral forces that push the heat exchanging elements 36 away from each other and against a respective internal corrugation surface 44. The heat exchanging elements 36 are pushed such that an even pressure distribution between the respective element surface 46 and the respective internal corrugation surface 44 is provided.

The force device 38 of this example comprises a bridging member 5o, here embodied as a plate. The bridging member 50 is attached, e.g. by gluing, to the inner joining sections 34 and thereby bridges the opening of the corrugation 26. The force device 38 further comprises a screw bolt 52, passing through the bridging member 5o, and a nut 54 threadingly engaging the screw bolt 52. By screwing the nut 54, the compression of the force device 38 can be adjusted. The screw bolt 52 and the nut 54 thereby constitute one example of an adjusting mechanism 56 for adjusting the forcing of the heat exchanging elements 36.

As shown in FIG. 4, the force device 38 is almost entirely accommodated inside the corrugation 26. The force device 38 in FIG. 4 is one of several possible devices for forcing the heat exchanging elements 36 against the respective internal corrugation surfaces 44.

By forcing the heat exchanging elements 36 against the internal corrugation surfaces 44, a good thermal contact can be maintained without needing welding, brazing or mechanical fasteners between the heat exchanging elements 36 and the internal corrugation surfaces 44. The heat exchanging arrangement 18 also has a compact design and does not substantially change an electrical insulation distance between the wall sections 20, 22 and the electronic device 16.

Figure 5:
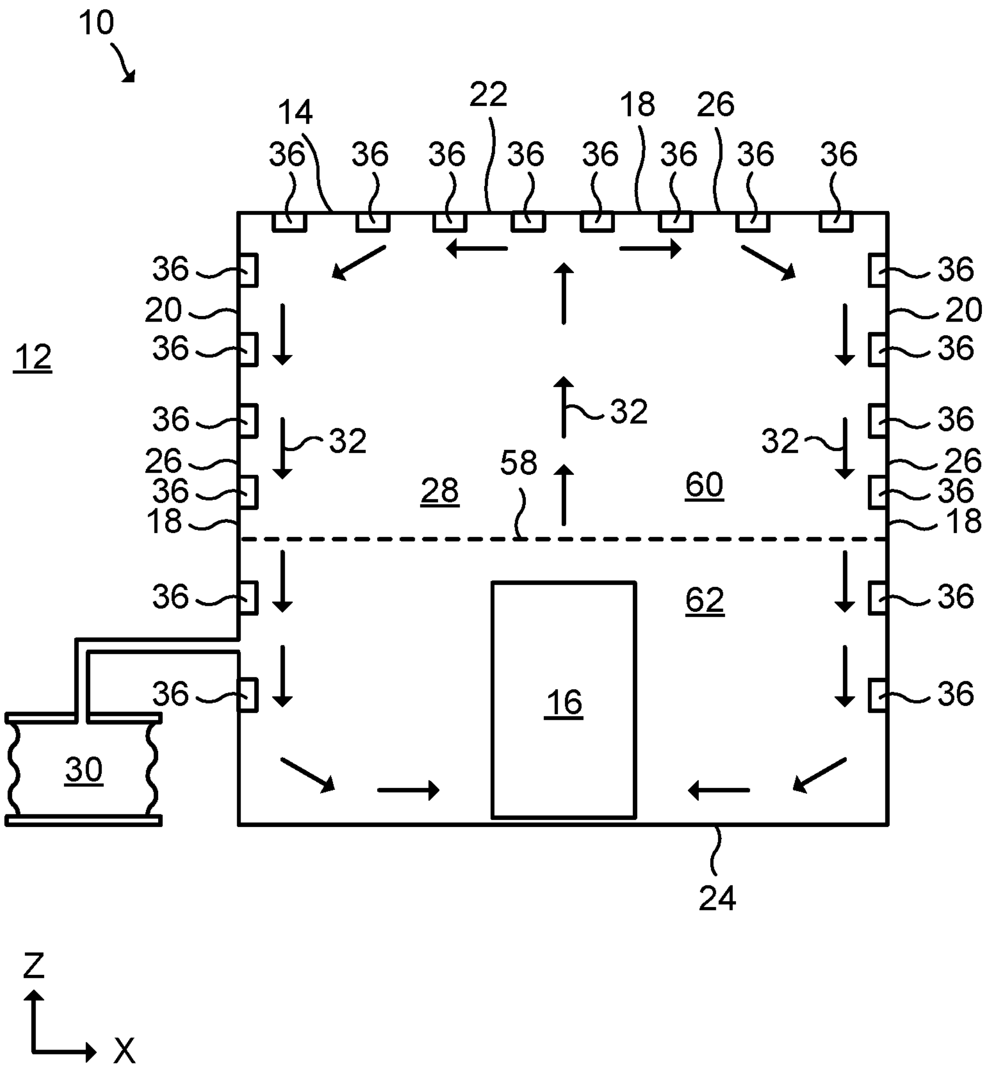
FIG. 5: schematically represents a side view of the subsea electronic system in FIG. 1 in more detail.

FIG. 5 schematically represents a side view of the subsea electronic system 10 in FIG. 1 in more detail. As indicated by imaginary line 58 in FIG. 5, the enclosure 14 is divided in an upper part 60 and a lower part 62. In this example, the upper part 60 is an upper half of an interior volume of the enclosure 14 and the lower part 62 is a lower half of the interior volume of the enclosure 14. The upper part 60 comprises the top wall section 22 and an upper part of each side wall section 20. The lower part 62 comprises the bottom 24 and a lower part of each side wall section 20.

As shown in FIG. 5, the subsea electronic system 10 comprises more heat exchanging elements 36 in corrugations 26 in the upper part 60 than in corrugations 26 in the lower part 62. Thus, a density of heat exchanging elements 36 is higher in the upper part 60 of the subsea electronic system 10 than in the lower part 62 of the subsea electronic system 10. A higher density of heat exchanging elements 36 in the upper part 60 than in the lower part 62 is advantageous due to the vertical stratification of the dielectric fluid 28, such as oil, and higher temperatures of the dielectric fluid 28 in the upper part 6o.

While the present disclosure has been described with reference to exemplary embodiments, it will be appreciated that the present invention is not limited to what has been described above. For example, it will be appreciated that the dimensions of the parts may be varied as needed.

The invention claimed is:

1. A heat exchanging arrangement for a subsea electronic system, the heat exchanging arrangement comprising:
- a wall section;
- a corrugation formed in the wall section, the corrugation having two generally opposing internal corrugation surfaces; and
- at least one heat exchanging element forced against at least one of the internal corrugation surfaces, the at least one heat exchanging element comprises an internal element structure for exposure to a dielectric fluid on an internal side of the wall section.

2. The heat exchanging arrangement according to claim 1, wherein the at least one heat exchanging element is pushed against the at least one of the internal corrugation surface.

3. The heat exchanging arrangement according to claim 2, wherein the at least one heat exchanging element comprises two heat exchanging elements, and wherein each heat exchanging element is forced against a respective internal corrugation surface.

4. The heat exchanging arrangement according to claim 3, wherein the heat exchanging arrangement comprises a force device arranged to force the at least one heat exchanging element against the at least one internal corrugation surface.

5. The heat exchanging arrangement according to claim 4, wherein the force device is arranged at least partly between the internal corrugation surface.

6. The heat exchanging arrangement according to claim 5, wherein the force device comprises a spring.

7. The heat exchanging arrangement according to claim 6, wherein the force device comprises an adjusting mechanism for adjusting the forcing of the at least one heat exchanging element.

8. The heat exchanging arrangement according to claim 1, wherein the internal corrugation surfaces are substantially flat.

9. The heat exchanging arrangement according to claim 1, wherein the internal corrugation surfaces are non-parallel, relative to each other.

10. The heat exchanging arrangement according to claim 1, wherein the at least one heat exchanging element comprises a substantially flat element surface for mating with a respective internal corrugation surface.

11. The heat exchanging arrangement according to claim 1, wherein the wall section and the corrugation are made of sheet metal or sheet steel.

12. A subsea electronic system comprising:
- a watertight enclosure containing dielectric fluid;
- at least one electronic device arranged inside the enclosure; and
- a heat exchanging arrangement according to claim 1;
- wherein the enclosure comprises the at least one wall section.

13. The subsea electronic system according to claim 12, wherein the at last one wall section comprises a top wall section.

14. The subsea electronic system according to claim 12, wherein, when the at least one electronic device is in use, the dielectric fluid circulates by natural convection.

15. The subsea electronic system according to claim 12, wherein the enclosure comprises an upper part and a lower part, wherein the heat exchanging arrangement comprises a plurality of heat exchanging elements, and wherein a density of heat exchanging elements is higher in the upper part than in the lower part.

16. The heat exchanging arrangement according to claim 1, wherein the at least one heat exchanging element comprises two heat exchanging elements, and wherein each heat exchanging element is forced against a respective internal corrugation surface.

17. The heat exchanging arrangement according to claim 1, wherein the heat exchanging arrangement comprises a force device arranged to force the at least one heat exchanging element against the at least one internal corrugation surface.

18. The heat exchanging arrangement according to claim 17, wherein the force device comprises a spring.

19. The subsea electronic system according to claim 13, wherein, when the at least one electronic device is in use, the dielectric fluid circulates by natural convection.

20. The subsea electronic system according to claim 13, wherein the enclosure comprises an upper part and a lower part, wherein the heat exchanging arrangement comprises a plurality of heat exchanging elements, and wherein a density of heat exchanging elements is higher in the upper part than in the lower part.

* * * * *